(12) United States Patent
Jung et al.

(10) Patent No.: US 9,379,260 B2
(45) Date of Patent: Jun. 28, 2016

(54) SOLAR CELL AND METHOD OF FABRICATING THE SAME

(71) Applicant: Electronics and Telecommunications Research Institute, Daejeon (KR)

(72) Inventors: Moon Youn Jung, Daejeon (KR); Seungkyoung Yang, Daejeon (KR); Kibong Song, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 353 days.

(21) Appl. No.: 13/971,796

(22) Filed: Aug. 20, 2013

(65) Prior Publication Data

US 2014/0166097 A1    Jun. 19, 2014

(30) Foreign Application Priority Data

Dec. 13, 2012  (KR) .................. 10-2012-0145575

(51) Int. Cl.
*H01L 31/0236* (2006.01)
*H01L 31/054* (2014.01)

(52) U.S. Cl.
CPC ...... *H01L 31/02363* (2013.01); *H01L 31/0543* (2014.12); *H01L 31/0547* (2014.12); *Y02E 10/52* (2013.01)

(58) Field of Classification Search
CPC ................ H01L 31/02363; H01L 31/0543; H01L 31/0547
USPC ........................................................ 136/256
See application file for complete search history.

(56) References Cited

U.S. PATENT DOCUMENTS

2013/0019941 A1* 1/2013 Briceno .......... H01L 31/022425
136/256

FOREIGN PATENT DOCUMENTS

WO    WO 2011/155373    * 12/2011

* cited by examiner

*Primary Examiner* — Jayne Mershon

(57) ABSTRACT

Provided is a solar cell including a first electrode, a first semiconductor layer on the first electrode, a second semiconductor layer on the first semiconductor layer, and a second electrode on the second semiconductor layer. The second semiconductor layer may include a nano wire that may be formed along a grain boundary of a top surface thereof to have a mesh-shaped structure.

8 Claims, 8 Drawing Sheets

SOLAR CELL AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2012-0145575, filed on Dec. 13, 2012, in the Korean Intellectual Property Office, the entire contents of which are hereby incorporated by reference.

BACKGROUND OF THE INVENTION

Example embodiments of the inventive concept relate to a solar cell and a method of fabricating the same, in particular, to a solar cell with a nano wire and a method of fabricating the same.

Recently, there is an increasing interest in new and renewable energy technologies. Especially, photovoltaic technologies have been actively developed. For example, it have been proven that energy conversion efficiencies of 18%, 15%, and 10% can be achieved from a single crystalline silicon solar cell, a poly silicon solar cell, and an amorphous silicon solar cell. To commercialize photovoltaic systems, it is necessary to develop a technology capable of reducing cost for solar cells.

The first practical photovoltaic cell with an energy conversion efficiency of about 4.5% was developed in 1954 at Bell Laboratories by Daryl Chapin, Calvin Souther Fuller and Gerald Pearson. Thereafter, a high-efficiency solar cell based on a crystalline silicon substrate was actively researched in Australia, Germany, and Japan, and in 1985, a high-efficiency silicon solar cell with an energy conversion efficiency of 20% or more was developed at University of New South Wales (UNSW) in Australia. In addition, a silicon solar cell with the highest efficiency of 24.7% was developed in 1999. As the market for solar electricity grows quickly, demand for a crystalline silicon solar cell is being significantly increased. For example, a crystalline silicon solar cell accounts for 93.5% of the total solar cell market of 1.8 GW, in 2005. Likewise, as the market rapidly grows, it is necessary to develop technology that can improve conversion efficiency, cost per watt, productivity, and so forth.

SUMMARY

Example embodiments of the inventive concept provide a solar cell with improved photovoltaic efficiency.

According to example embodiments of the inventive concepts, a solar cell may include a first electrode, a first semiconductor layer on the first electrode, a second semiconductor layer on the first semiconductor layer, and a second electrode on the second semiconductor layer. The second semiconductor layer may include a nano wire that may be formed along a grain boundary of a top surface thereof to have a mesh-shaped structure.

In example embodiments, a thickness of the nano wire may be less than half a thickness of the second semiconductor layer.

In example embodiments, the nano wire has a width ranging from 10 Å to 100 Å.

In example embodiments, the nano wire may include a metal.

In example embodiments, the second semiconductor layer may be a n-type silicon, and the first semiconductor layer may be a p-type silicon.

In example embodiments, at least one of the first and second semiconductor layers may be formed of poly silicon.

In example embodiments, the nano wire increases an intensity of light to be incident into the solar cell.

According to example embodiments of the inventive concepts, a method of fabricating a solar cell may include providing a first semiconductor layer, forming a second semiconductor layer on the first semiconductor layer, etching a grain boundary exposed through a top surface of the second semiconductor layer to form a recess region, and forming a nano wire in the recess region.

In example embodiments, the forming of the recess region may include a wet etching process.

In example embodiments, the wet etching process may be performed using an etching solution containing chromic acid.

In example embodiments, the forming of the recess region may include a dry etching process.

In example embodiments, the forming of the nano wire in the recess region may include filling the recess region with a metal layer: and removing the metal layer from the outside of the recess region.

In example embodiments, the removing of the metal layer from the outside of the recess region may include a CMP or etch-back process.

In example embodiments, the recess region may be formed to have a width ranging from 10 Å to 100 Å.

In example embodiments, the recess region may be formed to have a depth less than half a thickness of the second semiconductor layer.

In example embodiments, the forming of the second semiconductor layer may include injecting dopants, whose conductivity type may be different from that of the first semiconductor layer, into an upper portion of the first semiconductor layer.

In example embodiments, the method may further include forming a nano wire on a bottom surface of the first semiconductor layer.

In example embodiments, the forming of the nano wire on the bottom surface of the first semiconductor layer may include, etching a grain boundary exposed through the bottom surface of the first semiconductor layer to form a recess region, and forming a nano wire in the recess region of the first semiconductor layer.

In example embodiments, the method may further include forming a first electrode on a bottom surface of the first semiconductor layer, and forming a second electrode on the top surface of the second semiconductor layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
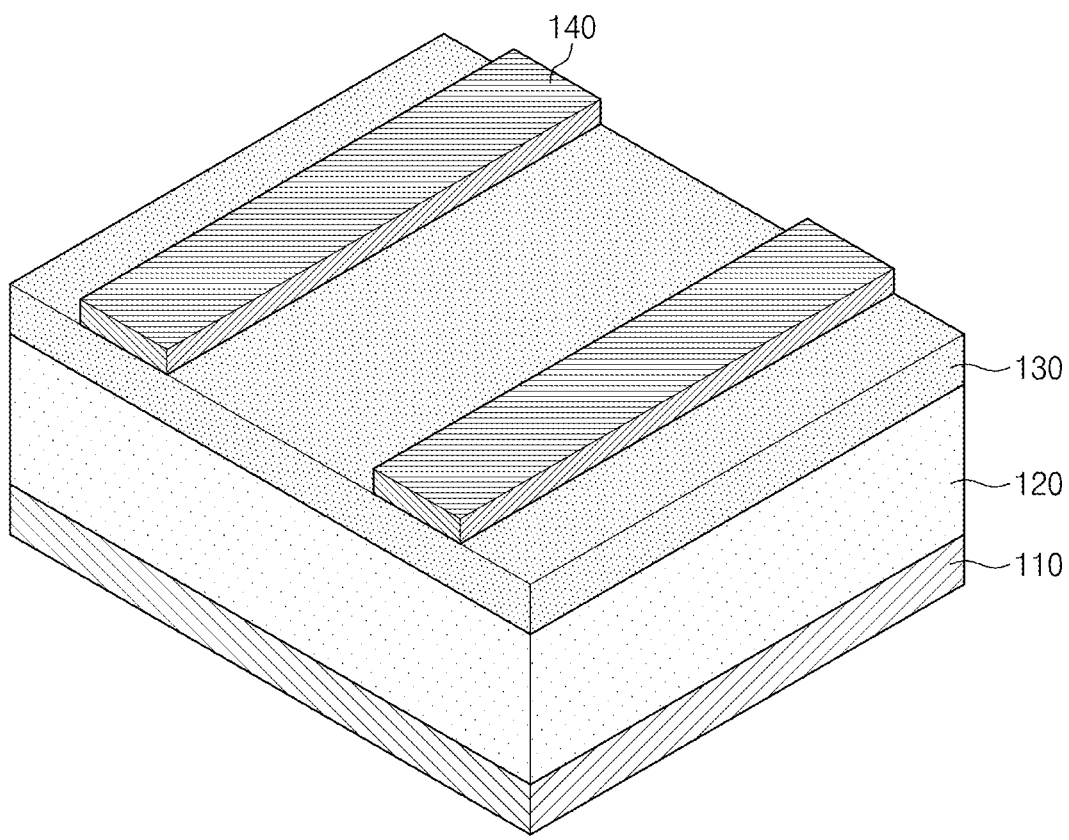
FIG. 1 is a perspective view of a solar cell according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a solar cell according to example embodiments of the inventive concept. Referring to FIG. 1, the solar cell may include a first electrode 110, a first semiconductor layer 120, a second semiconductor layer 130, and a second electrode 140 that are sequentially stacked. The first electrode 110 may be provided in the form of a plate and the second electrode 140 may be provided in the form of a line, but example embodiments of the inventive concepts may not be limited thereto. For example, positions and shapes of the first and second electrodes 110 and 140 may be variously changed in consideration of a direction of incident light and light-receiving efficiency. The first and second electrodes 110 and 140 may include at least one of metals or conductive metal nitrides. For example, the first and second electrodes 110 and 140 may include metals, such as aluminum, copper, nickel, iron, and tungsten.

The first semiconductor layer 120 and the second semiconductor layer 130 may be polycrystalline semiconductor layers. For example, the first semiconductor layer 120 may be a p-type silicon layer supplying holes, while the second semiconductor layer 130 may be an n-type silicon layer supplying electrons. The second semiconductor layer 130 may have a thickness that is less than that of the first semiconductor layer 120. In example embodiments, the second semiconductor layer 130 may be formed by injecting dopants into an upper portion of the first semiconductor layer 120, and the second semiconductor layer 130 may have a different conductivity type from that of the first semiconductor layer 120.

Figure 2:
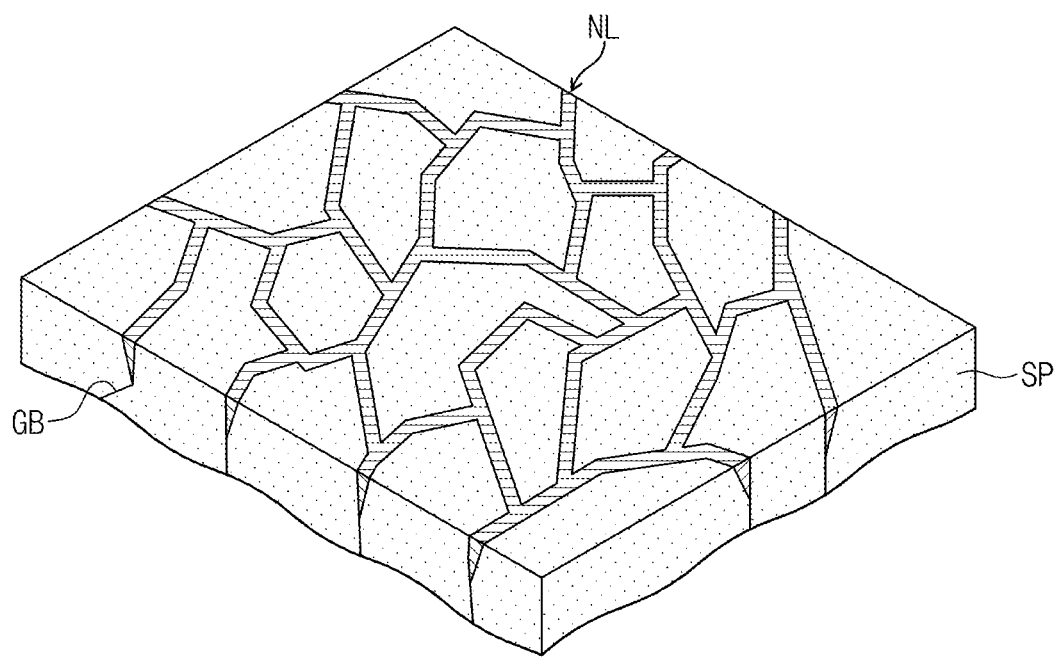
FIG. 2 is a schematic diagram provided to describe a nano wire according to example embodiments of the inventive concept.

FIG. 2 is a schematic diagram provided to describe a nano wire according to example embodiments of the inventive concept. A top surface of a semiconductor layer SP of FIG. 2 may correspond to a top surface of the second semiconductor layer 130 or a bottom surface of the first semiconductor layer 120 of FIG. 1. The semiconductor layer SP may include a nano wire NL provided on a top surface thereof The nano wire NL may be provided along a grain boundary GB to have a mesh-shaped structure. For example, the nano wire NL may be provided on the top surface of the second semiconductor layer 130 of FIG. 1 or the bottom surface of the first semiconductor layer 120 of FIG. 1. In certain embodiments, the nano wire NL may be provided on both of the top surface of the second semiconductor layer 130 and the bottom surface of the first semiconductor layer 120.

The nano wire NL may be formed of a metal-containing material. For example, the nano wire NL may be formed of highly conductive metal, such as gold (Au) or silver (Ag). The nano wire NL may have a thickness less than half that of the second semiconductor layer 130. The nano wire NL may have a width of about 10 Å-100 Å. The nano wire NL may be configured to improve photovoltaic efficiency of a solar cell using a surface plasmon effect. Hereinafter, the nano wire NL and the surface plasmon effect will be described in more detail.

Figure 3:
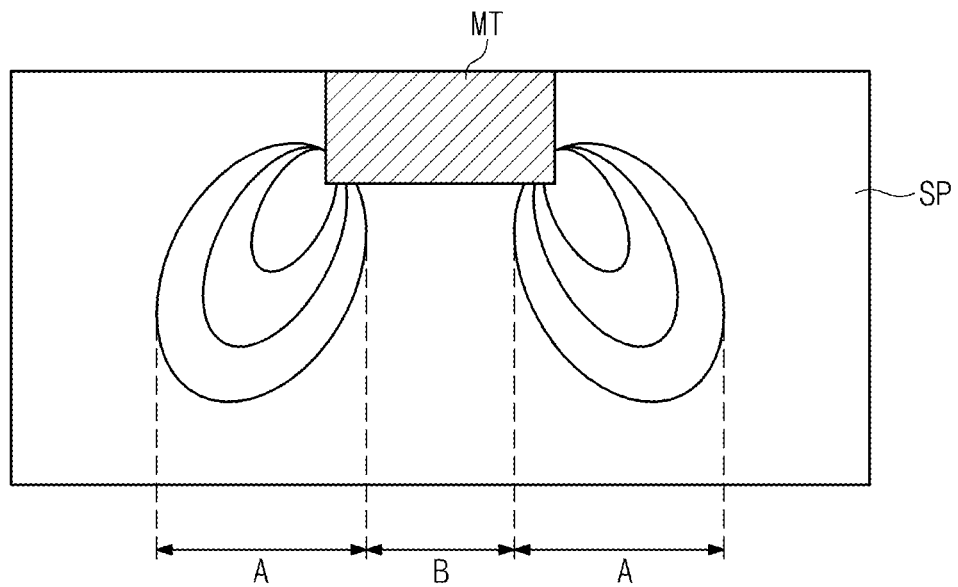
FIG. 3 is a schematic diagram illustrating a near-field produced by a surface plasmon effect.
Figure 4:
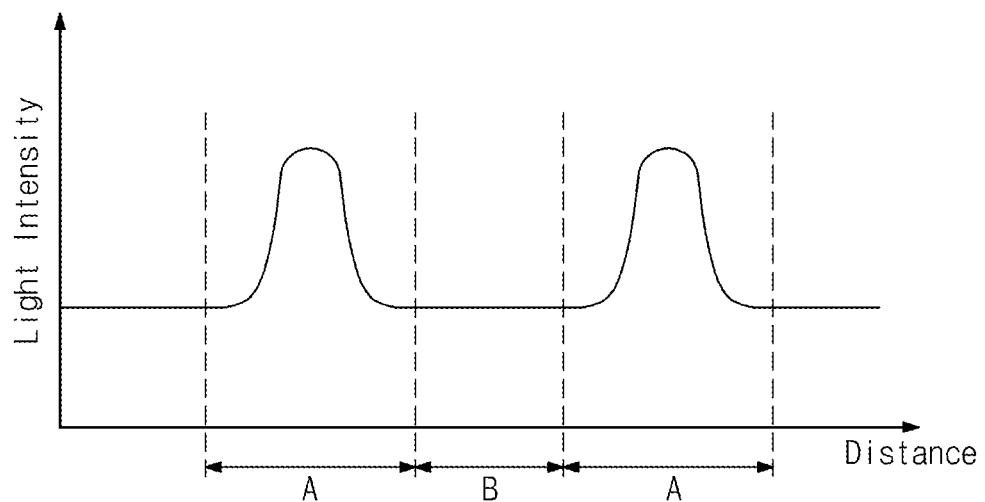
FIG. 4 is a graph illustrating a spatial variation of light intensity in a semiconductor layer that is caused by the near-field.

FIG. 3 is a schematic diagram illustrating a near-field produced by a surface plasmon effect. FIG. 4 is a graph illustrating a spatial variation of light intensity in a semiconductor layer that is caused by the near-field. In the case where a metal pattern MT is provided on a surface of the semiconductor layer SP and light is incident thereto, a very strong near-field may be produced at a peripheral region A of the metal pattern MT. In other words, if light is incident onto the metal pattern MT, electrons may be collectively oscillated by the incident photons, which is referred to as surface plasmon. An electric field intensified by the surface plasmon may significantly increase the number of electric charges in the solar cell. For example, if the semiconductor layer SP is an n-type, the number of electrons may be significantly increased by the surface plasmon. Alternatively, if the semiconductor layer SP is a p-type, the number of holes may be significantly increased by the surface plasmon.

An intensity of the near-field may be strongest at the peripheral region A of the metal pattern MT and decrease with increasing distance from the peripheral region A. For example, the intensity of the near-field may be very weak at a central region B between the peripheral regions A. In other words, the central region B may be weakly affected by an incident light, and the peripheral region A may be mainly exposed to the incident light. Accordingly, as shown in FIG. 4, an incident light may have intensity peaks at the peripheral regions A.

Figure 5:
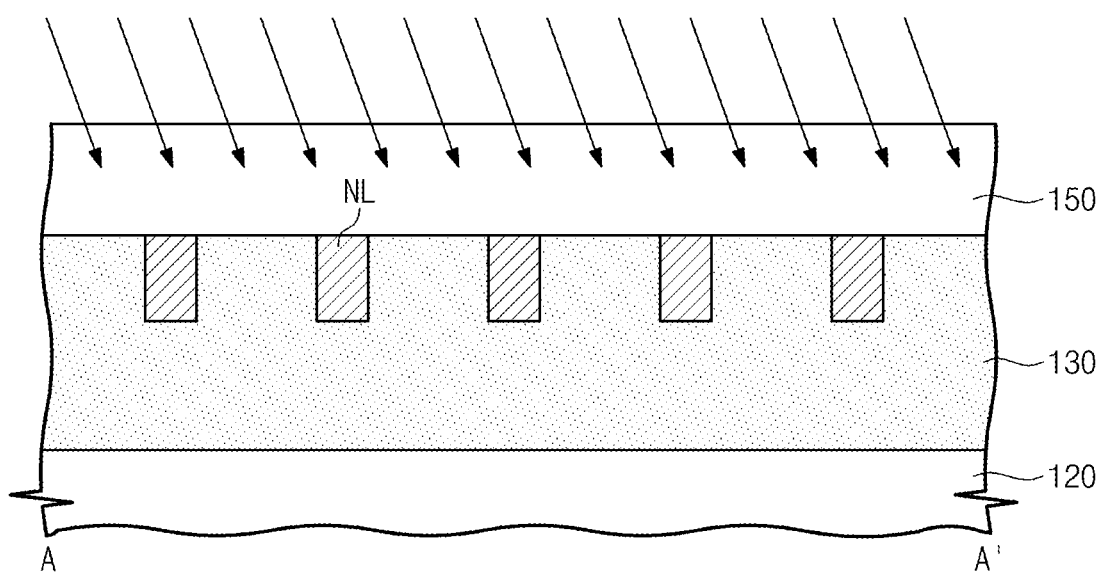
FIG. 5 is a schematic diagram illustrating a second semiconductor layer, in which nano wire according to example embodiments of the inventive concept are provided, and light incident thereto.
Figure 6A:
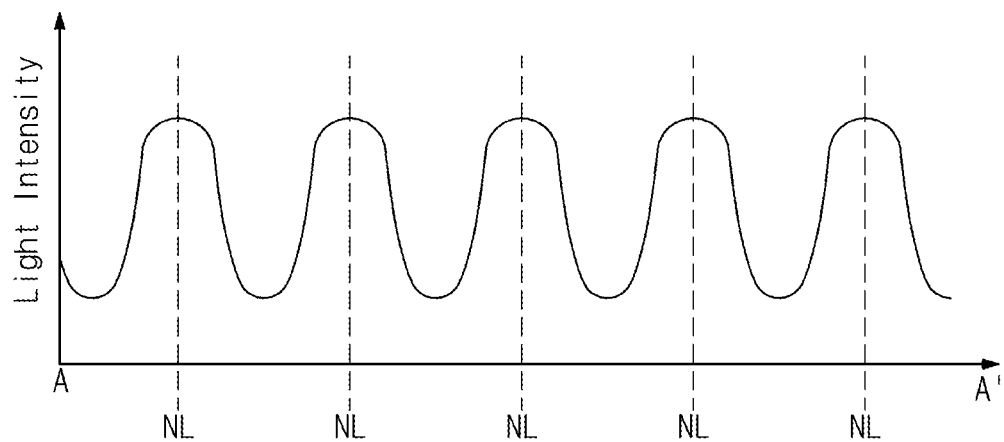
FIG. 6A is a graph showing an intensity profile of light, taken along line A-A' of FIG. 5.
Figure 6B:
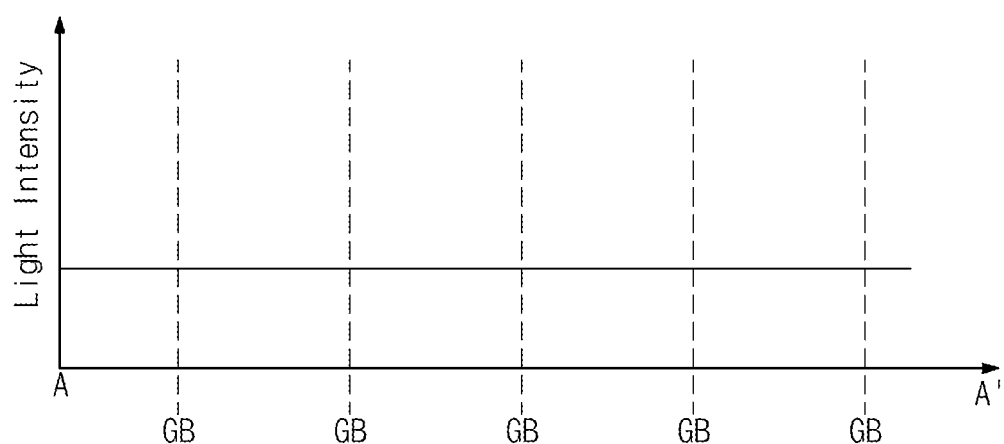
FIG. 6B is a graph showing an intensity profile of light, for a comparative example without any nano wire.

FIG. 5 is a schematic diagram illustrating a second semiconductor layer, in which nano wire according to example embodiments of the inventive concept are provided, and light incident thereto. FIG. 6A is a graph showing an intensity profile of light, taken along line A-A' of FIG. 5. FIG. 6B is a graph showing an intensity profile of light, for a comparative example without any nano wire.

In the case where the nano wire NL are formed on a surface of the second semiconductor layer 130 as the afore-described embodiments of the inventive concept, a light intensity may be increased near the nano wire NL, owing to the surface plasmon effect. In other words, an electron density may be increased in the second semiconductor layer 130. In example embodiments, a transparent protection layer 150 may be provided on the second semiconductor layer 130. For example, the transparent protection layer 150 may be glass.

According to example embodiments of the inventive concept, the nano wire NL may have a width ranging from several nanometers to several tens of nanometers and be uniformly distributed on the second semiconductor layer 130. Accordingly, it is possible to reduce the effect related to the central region B (for example, described with reference to FIG. 3). In other words, it is possible to induce uniformly the surface plasmon effect on the second semiconductor layer 130. By contrast, as shown in FIG. 6B, for the comparative example without nano wire, a light intensity may not be substantially changed near the grain boundary GB.

According to example embodiments of the inventive concept, a mesh-shaped nano wire may be formed along a grain boundary of a semiconductor layer, and this makes it possible to increase photovoltaic efficiency of a solar cell.

Figure 7:
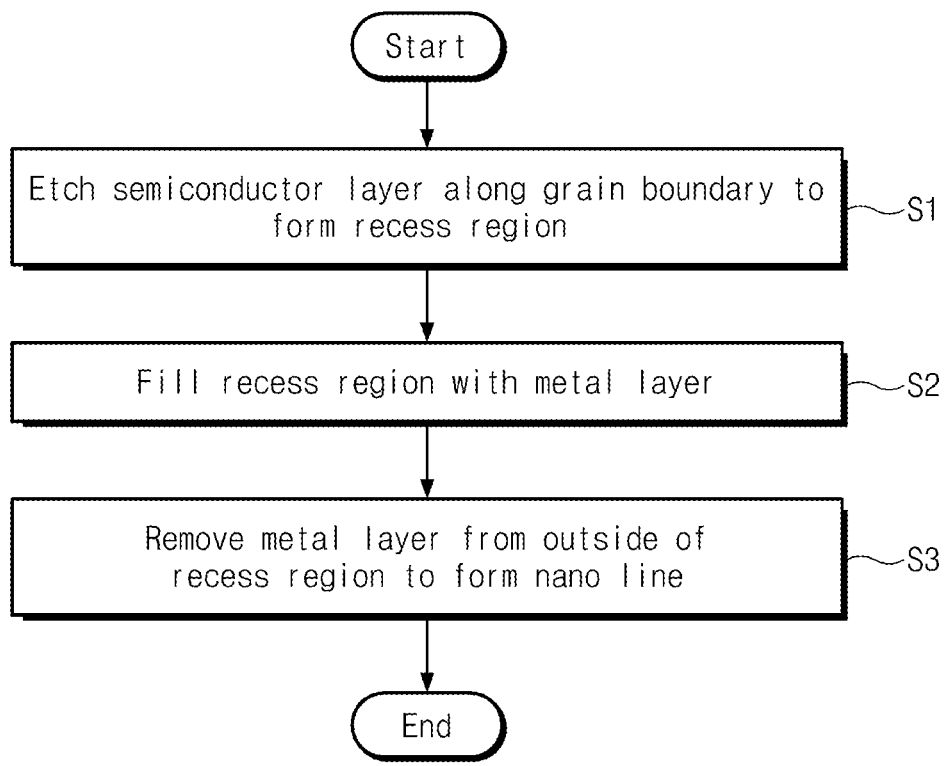
FIG. 7 is a flow chart illustrating a method of fabricating a solar cell, according to example embodiments of the inventive concept.
Figure 8:
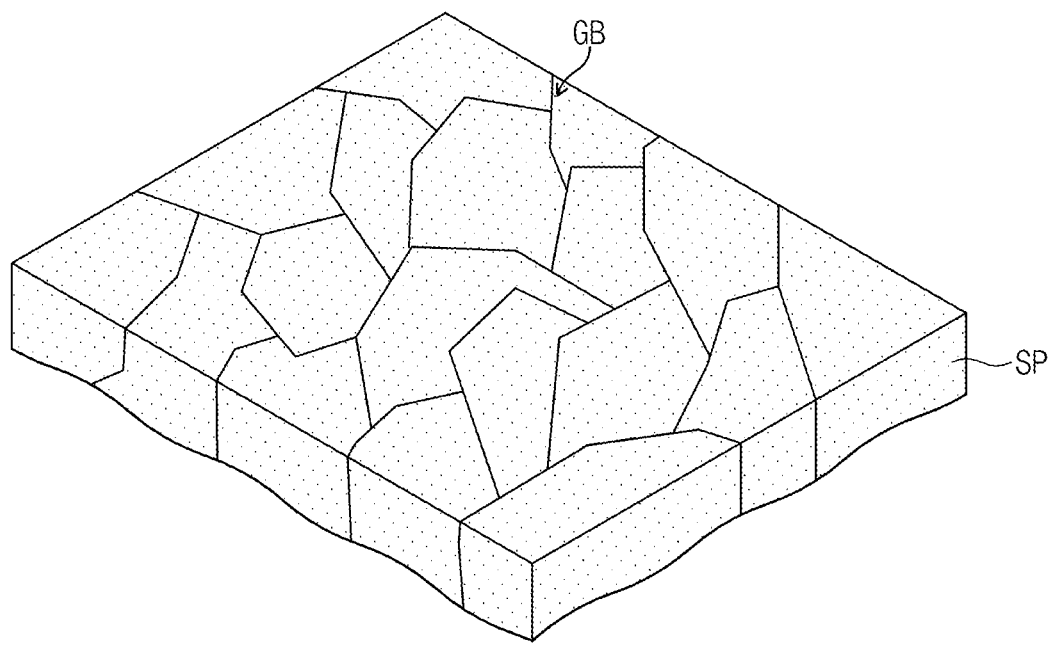
FIGS. 8 and 9 are sectional views illustrating a method of fabricating a solar cell, according to example embodiments of the inventive concept.
Figure 9:
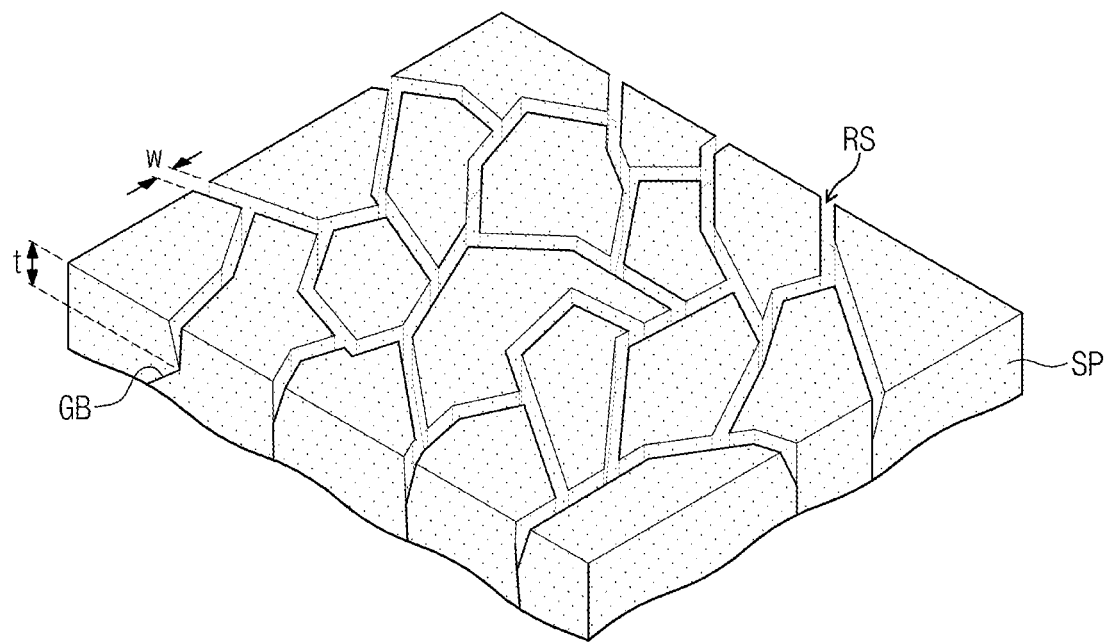

FIG. 7 is a flow chart illustrating a method of fabricating a solar cell, according to example embodiments of the inventive concept. FIGS. 8 and 9 are sectional views illustrating a method of fabricating a solar cell, according to example embodiments of the inventive concept.

FIG. 8 shows a grain boundary GB at a top surface of the semiconductor layer SP. In the case where the semiconductor layer SP has a polycrystalline structure, it may have the grain boundary GB, which may be used to form the nano wire according to example embodiments of the inventive concept. A density of the grain boundary GB may be determined by a grain size, and thus, densities of the grain boundary GB and the nano wire may be easily controlled by adjusting the grain size of the semiconductor layer SP. In example embodiments, the semiconductor layer SP may be adjusted to have the grain size ranging from several tens of nanometers to several hundreds of micrometers.

The top surface of the semiconductor layer SP of FIG. 8 may correspond to the top surface of the second semiconductor layer 130 of FIG. 1 or the bottom surface of the first semiconductor layer 120 of FIG. 1.

Referring to FIGS. 7 and 9, the semiconductor layer SP may be etched along the grain boundary GB to form a recess region RS (in S1). The grain boundary GB may be etched with a higher etch rate, compared with other portions of the semiconductor layer SP, because the grain boundary GB may have many crystal defects, such as dislocation.

The etching of the semiconductor layer SP may be performed using a wet etching process. For example, the wet etching process may be performed using an etching solution containing chromic acid. In other embodiments, the etching process may be performed using a dry etching process.

A shape of the recess region RS may be determined in consideration of a width of a desired nano wire. For example, the recess region RS may be formed to have a width w ranging from 10 Å to 100 Å and a depth t less than half a thickness of the semiconductor layer SP, but example embodiments of the inventive concepts may not be limited thereto. A shape of the recess region RS may be modified by adjusting an etch recipe to be used for the etching process.

Referring to FIG. 7, a metal layer (not shown) may be formed to fill the recess region RS (in S2). The metal layer may be formed to cover a whole top surface of the semiconductor layer SP. The metal layer may be formed of a highly conductive material, such as gold (Au) or silver (Ag). The formation of the metal layer may include a sputtering process.

Referring back to FIGS. 7 and 2, the metal layer may be removed from the outside of the recess region RS, and thus, the nano wire NL may remain in the recess region RS (in S3). For example, the removal of the metal layer may be performed using a chemical mechanical polishing (CMP) and/or etch-back process. Thereafter, the first and second electrodes of the solar cell may be formed.

According to example embodiments of the inventive concept, a nano wire for inducing a surface plasmon effect may be easily formed by using a grain boundary.

According to example embodiments of the inventive concept, a surface plasmon effect may be used to increase an intensity of incident light, and thus, a solar cell can have an improved photovoltaic efficiency. The surface plasmon effect may be induced by a nano wire that may be easily formed by utilizing a grain boundary.

While example embodiments of the inventive concepts have been particularly shown and described, it will be understood by one of ordinary skill in the art that variations in form and detail may be made therein without departing from the spirit and scope of the attached claims.

What is claimed is:

1. A solar cell, comprising:
a first electrode;
a first semiconductor layer on the first electrode;
a second semiconductor layer on the first semiconductor layer; and
a second electrode on the second semiconductor layer,
wherein the second semiconductor layer comprises a nano wire that is formed along a grain boundary of a top surface thereof to have a mesh-shaped structure.

2. The solar cell of claim 1, wherein a thickness of the nano wire is less than half a thickness of the second semiconductor layer.

3. The solar cell of claim 1, wherein the nano wire has a width ranging from 10 Å to 100 Å.

4. The solar cell of claim 1, wherein the nano wire comprises a metal.

5. The solar cell of claim 1, wherein the second semiconductor layer is a n-type silicon.

6. The solar cell of claim 5, wherein, the first semiconductor layer is a p-type silicon.

7. The solar cell of claim 5, wherein at least one of the first and second semiconductor layers are formed of poly silicon.

8. The solar cell of claim 1, wherein the nano wire increases an intensity of light to be incident into the solar cell.

* * * * *